(12) United States Patent
Nakano et al.

(10) Patent No.: US 12,424,406 B2
(45) Date of Patent: Sep. 23, 2025

(54) CHARGED PARTICLE BEAM DEVICE, AND METHOD FOR ADJUSTING IMAGE CAPTURING CONDITIONS IN SAID CHARGED PARTICLE BEAM DEVICE

(71) Applicant: Hitachi High-Tech Corporation, Tokyo (JP)

(72) Inventors: Tomohito Nakano, Tokyo (JP); Makoto Suzuki, Tokyo (JP); Yuzuru Mizuhara, Tokyo (JP); Ryota Watanabe, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 424 days.

(21) Appl. No.: 18/009,898

(22) PCT Filed: Jul. 3, 2020

(86) PCT No.: PCT/JP2020/026114
§ 371 (c)(1),
(2) Date: Dec. 12, 2022

(87) PCT Pub. No.: WO2022/003927
PCT Pub. Date: Jan. 6, 2022

(65) Prior Publication Data
US 2023/0230796 A1    Jul. 20, 2023

(51) Int. Cl.
*H01J 37/141*    (2006.01)
*H01J 37/153*    (2006.01)
(Continued)

(52) U.S. Cl.
CPC .......... *H01J 37/141* (2013.01); *H01J 37/153* (2013.01); *H01J 37/21* (2013.01); *H01J 37/28* (2013.01); *H01J 2237/216* (2013.01)

(58) Field of Classification Search
CPC .......... H01J 37/00; H01J 37/02; H01J 37/141; H01J 37/153; H01J 37/21; H01J 37/26;
(Continued)

(56) References Cited

U.S. PATENT DOCUMENTS 10,062,542 B2    8/2018  Preikszas
2002/0074495 A1*  6/2002  Notte, IV ............ H01J 37/265
                                                          250/311
(Continued)

FOREIGN PATENT DOCUMENTS

DE   10 2015 001 297 A1    8/2016
JP          3458481 B2       8/2003
JP        2020-017451 A     1/2020

OTHER PUBLICATIONS

Office action issued in corresponding German Patent Application No. 112020007022.0 issued on Dec. 21, 2022.
(Continued)

*Primary Examiner* — Jason L McCormack
(74) *Attorney, Agent, or Firm* — Foley & Lardner LLP

(57) ABSTRACT

This charged particle beam device comprises: a charged particle beam source that generates charged particle beams; an objective lens in which coil current is inputted to focus the charged particle beams on a sample; a control unit that controls the coil current; a hysteresis characteristics storage unit that stores hysteresis characteristics information of the objective lens; a history information storage unit that stores history information relating to the coil current; and an estimating unit that estimates the magnetic field generated by the objective lens based on the coil current, the history information, and the hysteresis characteristic information, and has a magnetic field correction unit that, when the absolute value of the change amount of the coil current is greater than a prescribed value, further adds to the magnetic field estimated by the estimating unit a correction value
(Continued)

according to the coil current and its change amount, correcting the magnetic field generated by the objective lens.

7 Claims, 8 Drawing Sheets

(51) Int. Cl.
    *H01J 37/21* (2006.01)
    *H01J 37/28* (2006.01)
(58) Field of Classification Search
    CPC .............. H01J 37/28; H01J 2237/216; H01J 2237/04922; H01J 2237/153
    USPC .................... 250/306, 307, 311, 396 ML
    See application file for complete search history.

(56) References Cited

U.S. PATENT DOCUMENTS

2019/0172676 A1* 6/2019 Nakano ................ H01J 37/222
2020/0035449 A1* 1/2020 Nakano ................ H01J 37/141

OTHER PUBLICATIONS

International Search Report with English Translation and Written Opinion in International Application PCT/JP2020/026114 dated Sep. 29, 2020.

\* cited by examiner

CHARGED PARTICLE BEAM DEVICE, AND METHOD FOR ADJUSTING IMAGE CAPTURING CONDITIONS IN SAID CHARGED PARTICLE BEAM DEVICE

TECHNICAL FIELD

The present invention relates to a charged particle beam device and an imaging condition adjustment method in the charged particle beam device.

BACKGROUND ART

As a charged particle beam device, for example, a scanning electron microscope (SEM) is known. In addition to a general-purpose scanning electron microscope, there are a critical dimension SEM (CD-SEM), a review SEM, and the like.

In the scanning electron microscope, an electron beam emitted from an electron source is converged by a magnetic field generated by an objective lens and irradiated on a sample, and backscattered electrons, secondary electrons, and the like generated are measured and imaging is performed. At this time, it is necessary to adjust the focal position of the electron beam according to the height of the sample, but this can be realized by adjusting the coil current input to the objective lens.

However, the magnetic circuit of the objective lens is generally made of a ferromagnetic material, and the relationship between the coil current and the magnetic field generated by the objective lens is not uniquely determined due to the influence of the magnetic hysteresis, which causes errors in the deflection magnification and the image rotation. As a method for avoiding this, for example, PTL 1 discloses an electron microscope that executes an operation called lens reset in order to keep a relationship between a coil current of an objective lens and a magnetic field constant. The lens reset operation is an operation of imparting a constant (known) hysteresis to the magnetic circuit of the objective lens by once decreasing the coil current of the objective lens to a minimum value and then increasing the coil current again, so that the relationship between the coil current and the magnetic field can be uniquely determined.

However, in this lens reset operation, since the coil current input to the objective lens is greatly changed, there is a problem that an eddy current is generated in the magnetic circuit, the response of the magnetic field is delayed, and the throughput (the number of images captured per unit time) of the scanning electron microscope is greatly reduced.

In order to solve this problem, PTL 2 discloses an electron microscope that estimates a magnetic field generated by a lens using hysteresis characteristics of an objective lens and history information of a coil current. However, in the method of PTL 2, the frequency of the lens reset operation is reduced and the throughput is improved, but the magnetic field cannot be accurately estimated. It has been found by the analysis of the inventors up to the present invention that the cause is an eddy current when the coil current changes.

CITATION LIST

Patent Literature

PTL 1: JP 3458481 B2
PTL 2: JP 2020-17451 A

SUMMARY OF INVENTION

Technical Problem

The present invention provides a charged particle beam device capable of accurately estimating a magnetic field while reducing the frequency of a lens reset operation and improving the throughput, and an imaging condition adjustment method in the charged particle beam device.

Solution to Problem

In order to solve the above problem, a charged particle beam device according to the present invention includes: a charged particle beam source that generates charged particle beams; an objective lens in which coil current is inputted to focus the charged particle beams on a sample; a control unit that controls the coil current; a hysteresis characteristic storage unit that stores hysteresis characteristic information of the objective lens; a history information storage unit that stores history information relating to the coil current; an estimating unit that estimates a magnetic field generated by the objective lens based on the coil current, the history information, and the hysteresis characteristic information; and a magnetic field correction unit that, when an absolute value of a change amount of the coil current is greater than a predetermined value, further adds a correction value corresponding to the coil current and the change amount of the coil current to the magnetic field estimated by the estimating unit to correct the magnetic field generated by the objective lens. In addition, a charged particle beam device according to another aspect of the present invention includes: a charged particle beam source that generates charged particle beams; an objective lens in which coil current is inputted to focus the charged particle beams on a sample; a control unit that controls the coil current; a hysteresis characteristic storage unit that stores hysteresis characteristic information of the objective lens; a history information storage unit that stores history information relating to the coil current; an estimating unit that estimates the magnetic field generated by the objective lens based on the coil current, the history information, and the hysteresis characteristic information; and a current correction unit that, when an absolute value of a change amount of the coil current is larger than a predetermined value, corrects the coil current based on a correction value corresponding to the coil current and the change amount of the coil current.

Advantageous Effects of Invention

According to the present invention, it is possible to provide a charged particle beam device capable of accurately estimating a magnetic field while reducing the frequency of lens reset and improving the throughput while suppressing errors in deflection magnification and image rotation.

DESCRIPTION OF EMBODIMENTS

Hereinafter, the present embodiment will be described with reference to the accompanying drawings. In the accompanying drawings, functionally same elements may be denoted by the same numbers. Note that, although the accompanying drawings illustrate embodiments and implementation examples conforming to the principles of the present disclosure, these are for understanding the present disclosure and are not used to interpret the present disclosure in a limited manner. The description herein is exemplary only and is not intended to limit the claims or applications of the disclosure in any way.

In the present embodiment, the description has been made in sufficient detail for those skilled in the art to implement the present disclosure, but it is necessary to understand that other implementations and embodiments are possible, and changes in configurations and structures and replacement of various elements are possible without departing from the scope and spirit of the technical idea of the present disclosure. Therefore, the following description should not be interpreted as being limited thereto. In the following embodiment, a scanning electron microscope will be described as an example, but the present invention can also be applied to other types of electron microscopes (CD-SEM, review SEM, or the like) without departing from the gist of the invention.

First Embodiment

Figure 1:
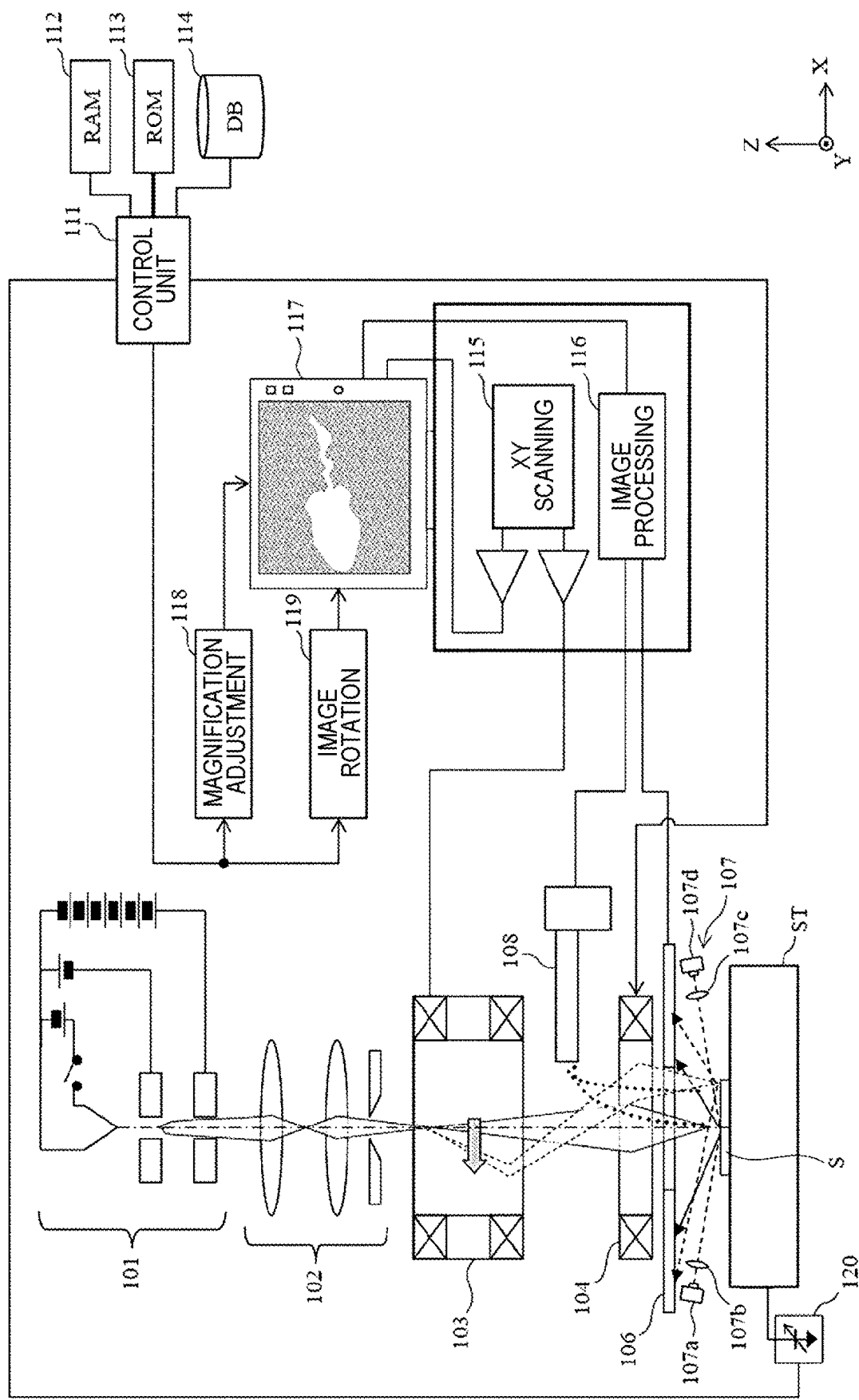
FIG. 1 is a schematic view of a scanning electron microscope (SEM) according to a first embodiment.

First, a first embodiment of the present invention will be described. FIG. 1 is a schematic view of a scanning electron microscope (SEM) according to the first embodiment. As an example, the scanning electron microscope includes an electron gun 101, a focusing lens 102, a scanning coil 103, an objective lens 104, a primary electron detector 106, a stage ST, an object surface position detector 107, and a secondary electron detector 108.

The electron gun 101 (charged particle beam source) accelerates electrons at a predetermined acceleration voltage to generate an electron beam as a charged particle beam. The focusing lens 102 focuses the electron beam to reduce the diameter of the electron beam. The scanning coil 103 has a role of scanning the electron beam. When the coil current Iobj is input, the objective lens 104 condenses (converges) the electron beam and irradiates the sample S placed on the stage ST with the electron beam having a diameter of about several nanometers. The electron beam moves on the sample S by the voltage applied to the scanning coil 103.

The primary electron detector 106 is a detector that detects primary electrons (backscattered electrons) reflected from the sample S. The object surface position detector 107 is a detector for detecting the height of the surface of the sample S in the Z direction. The object surface position detector 107 includes, for example, a light source 107a, an imaging lens 107b, a condenser lens 107c, and a light receiving element 107d. The position (object surface position Zs) of the surface of the sample S in the Z direction can be determined by determining the light receiving state in the light receiving element 107d.

The secondary electron detector 108 is a detector that detects secondary electrons generated from the sample S. Image information of the sample S is generated based on the output signals of the primary electron detector 106 and the secondary electron detector 108 described above.

In addition, the scanning electron microscope includes a control unit 111, a RAM 112, a ROM 113, a database 114, an XY scanning unit 115, an image processing unit 116, a display 117, a magnification adjustment unit 118, an image rotation unit 119, and a retarding voltage control unit 120.

The control unit 111 controls the operation of the entire scanning electron microscope by controlling various voltages and currents in the scanning electron microscope. The RAM 112 and the ROM 113 have a role of storing programs and data used for control operation. The RAM 112 also functions as a history information storage unit that stores a history of changes in the coil current Iobj.

As described later, the database 114 stores the hysteresis characteristic information of the objective lens 104, and stores a table in which the coil current Iobj input to the objective lens 104, a change amount ΔIobj of the coil current Iobj, and a correction value δBobj corresponding thereto are associated with each other. That is, the database 114 functions as a hysteresis characteristic storage unit that stores the hysteresis characteristic information of the objective lens 104. The control unit 111 functions as an estimating unit that estimates the magnetic field generated by the objective lens 104 on the basis of the coil current Iobj, history information of the coil current Iobj (change in the coil current Iobj), and hysteresis information of the objective lens 104. In addition, the control unit 111 has a role as a magnetic field correction unit that corrects the value of the magnetic field estimated according to a method to be described later in a case where the change amount ΔIobj is larger than a predetermined value in the estimation.

The XY scanning unit 115 scans the electron beam in the XY direction according to the size of the scanning region and the scanning speed. In addition, the image processing unit 116 executes image processing according to an output signal of the primary electron detector 106 and/or the secondary electron detector 108, and generates image data to be displayed on the display 117. The display 117 displays the image on the display screen in accordance with image data (signal) generated by the image processing unit 116 processing the signals from the detectors 106 and 108. The magnification adjustment unit 118 adjusts the magnification of the image data generated by the image processing unit 116 according to a control signal from the control unit 111. In addition, the image rotation unit 119 rotates the image data generated by the image processing unit 116 in accordance with the control signal from the control unit 111.

The retarding voltage control unit 120 controls a retarding voltage Vr applied to the stage ST in accordance with the control signal from the control unit 111. The retarding voltage Vr is a negative voltage applied to the sample S or the vicinity thereof, and decelerates the electron beam accelerated by the electron gun 101 immediately before the sample S. By decelerating the electron beam, the focal position in the sample S can be adjusted. However, when the retarding voltage Vr is applied, distortion of the electric field may occur, and the magnification and the angle of the obtained SEM image may change.

Figure 2:
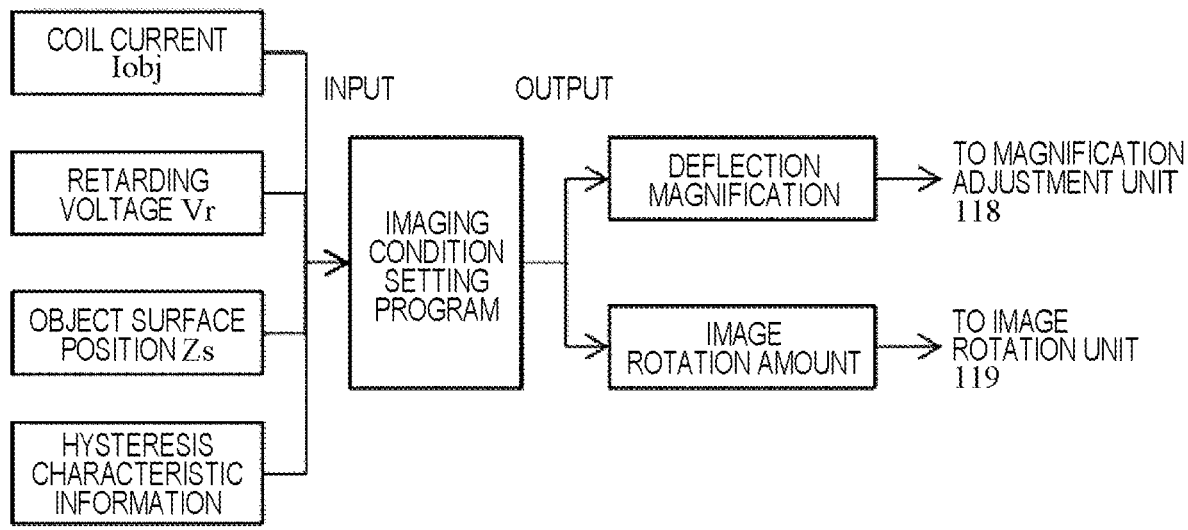
FIG. 2 is a block diagram illustrating an imaging condition setting program of the scanning electron microscope (SEM) according to the first embodiment.

The control program stored in the ROM 113 includes an imaging condition setting program for setting an imaging condition of the sample S. As illustrated in FIG. 2, the imaging condition setting program calculates the deflection magnification and the image rotation amount based on information on the coil current Iobj, information on the retarding voltage Vr, information on the object surface position Zs, and the hysteresis characteristic information stored in the database 114, and supplies the calculated deflection magnification and the calculated image rotation amount to the magnification adjustment unit 118 and the image rotation unit 119. Details of the hysteresis characteristic information and correction current according to the change amount or history of the current will be described later. Note that information input to the imaging condition setting program as a factor of setting the imaging condition is not limited to the above information, and another information may be input instead of or in addition to the above information.

The objective lens 104 includes a coil and a magnetic circuit made of a ferromagnetic material such as iron. When a current is input to the coil based on the sample height measured by the object surface position detector 107, a magnetic field is generated on the optical axis. At this time, since the ferromagnetic material has hysteresis characteristics, the ferromagnetic material is magnetized according to the history of the current. Therefore, even if the coil current Iobj is set to a certain value, a magnetic flux density Bobj on the optical axis varies depending on the amount of magnetization of the ferromagnetic material, and is not uniquely determined in relation to the coil current Iobj.

Figure 3:
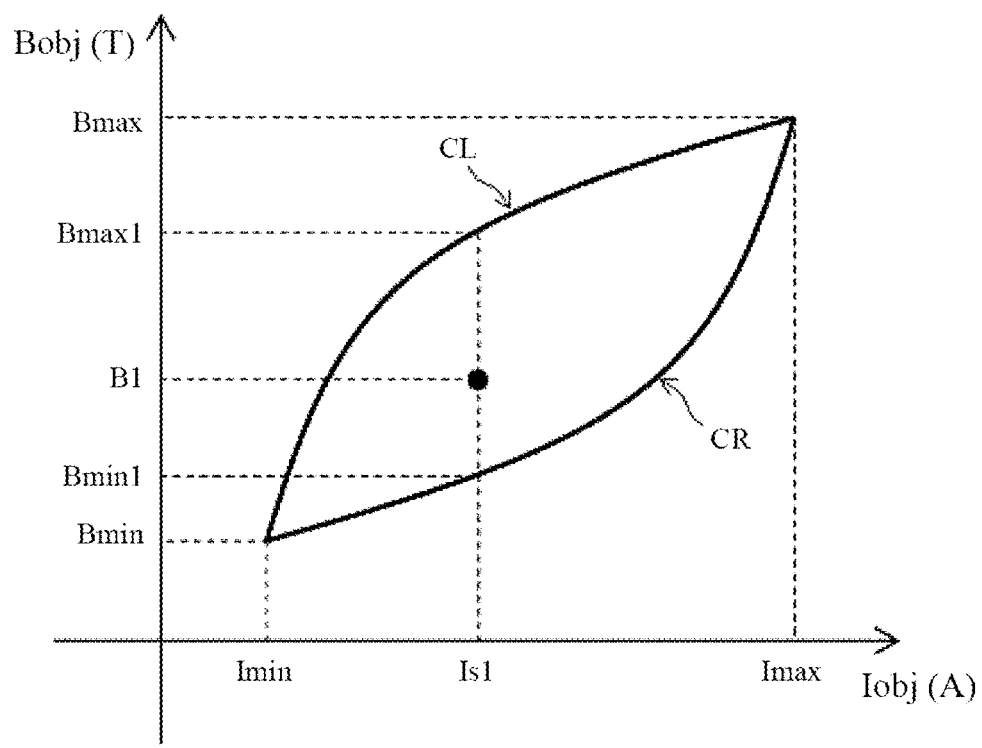
FIG. 3 is a graph for explaining hysteresis characteristics of the objective lens.

Hysteresis characteristics of objective lens 104 will be described with reference to FIG. 3. It is assumed that the maximum value of the coil current Iobj input to the coil of the objective lens 104 is Imax and the minimum value thereof is Imin. In addition, it is assumed that the maximum value of the magnetic flux density Bobj of the magnetism generated around the objective lens 104 by the coil current Iobj is Bmax, and the minimum value thereof is Bmin.

When the coil current Iobj increases from the minimum value Imin, the relationship between the coil current Iobj and the magnetic flux density Bobj is defined by the ascending curve CR. Conversely, when the coil current Iobj is decreased from the maximum value Imax, the relationship between the coil current Iobj and the magnetic flux density Bobj is defined by the descending curve CL. That is, while the coil current Iobj monotonously increases from the minimum value Imin or monotonously decreases from the maximum value Imax, the magnetic flux density Bobj is defined by the ascending curve CR or the descending curve CL, and when the coil current Iobj is determined, the magnetic flux density Bobj is uniquely determined. In general, in the scanning electron microscope, the ascending curve CR or the descending curve CL is obtained in advance, and the value of the magnetic flux density Bobj is calculated (estimated) with reference to the data of these curves.

On the other hand, when the coil current Iobj changes between the maximum value Imax and the minimum value Imin through various histories by switching the increase and decrease, the relationship between the coil current Iobj and the magnetic flux density Bobj is any one within the range of the closed curve C surrounded by the descending curve CL and the ascending curve CR, and the relationship between the coil current Iobj and the magnetic flux density Bobj is not uniquely determined. For example, even if the value of the coil current Iobj is determined to be Is1, the value B1 (see FIG. 3) of the magnetic flux density Bobj becomes any value between the maximum value Bmax1 and the minimum value Bmin1 depending on the history of the fluctuation of the coil current Iobj, and the value of the magnetic flux density Bobj cannot be uniquely estimated.

Figure 4:
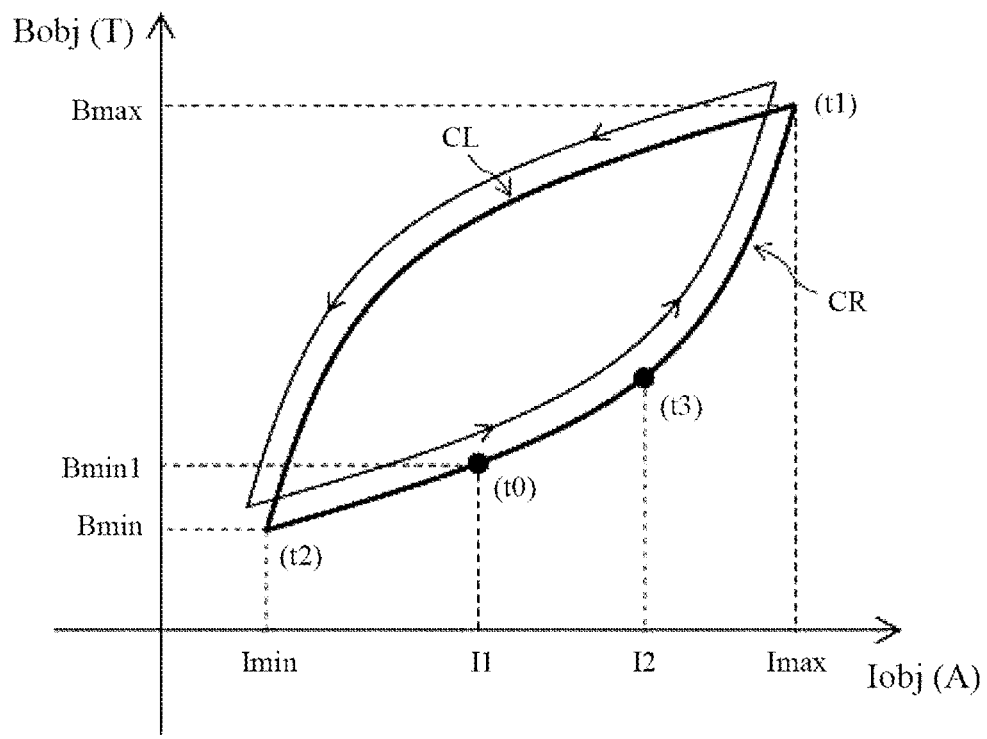
FIG. 4 is a schematic diagram illustrating a specific example of a lens reset operation.
Figure 5:
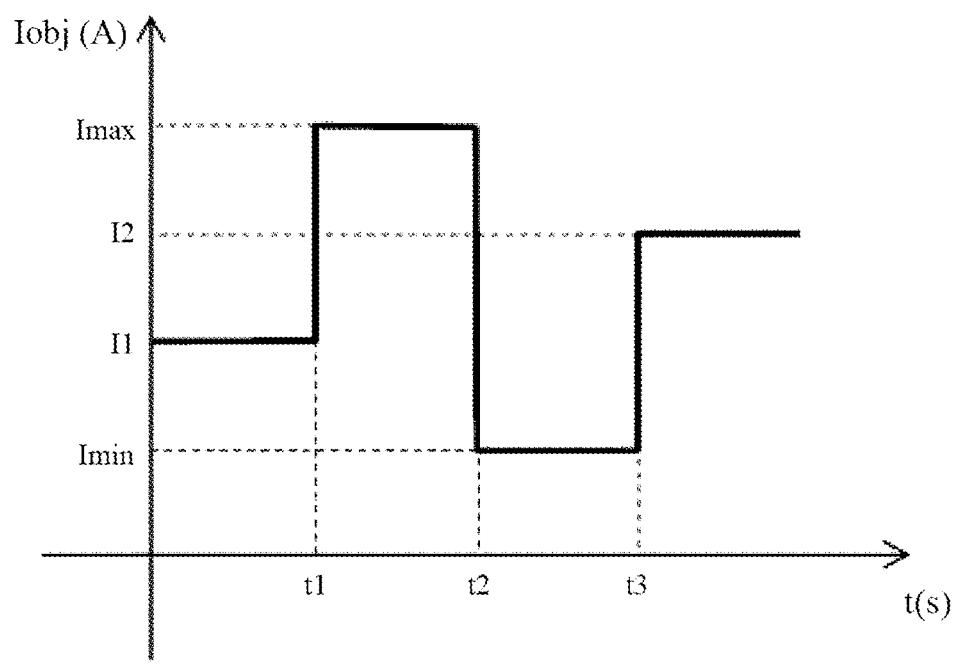
FIG. 5 is a graph for explaining the specific example of the lens reset operation.

If the relationship between the coil current Iobj and the magnetic flux density Bobj is not uniquely determined, an error is included in the deflection magnification/image rotation amount calculated using the coil current Iobj as an input, and reproducibility of an image and a measured length value is deteriorated. In order to avoid this error, an operation called lens reset is executed. As described above, the lens reset operation is an operation of resetting the magnetic hysteresis of the objective lens by changing the coil current of the objective lens so as to pass through the minimum value and the maximum value and then setting the coil current to a target value. A specific example of the lens reset operation will be described with reference to FIGS. 4 and 5. FIG. 4 is a graph illustrating changes in the coil current Iobj and the magnetic flux density Bobj during the lens reset operation, and FIG. 5 is a graph illustrating a temporal change in the coil current Iobj.

A case where the value of the coil current Iobj is $I_1$ at time t0, and then the coil current Iobj is varied to a target value $I_2$ larger than $I_1$ by a predetermined value or more is considered. As described above, when the fluctuation range ($\Delta Iobj=I_2-I_1$) of the coil current Iobj is larger than the predetermined value (threshold), the lens reset operation is executed. In the lens reset operation, first, the coil current Iobj is increased to the maximum value Imax at time t1, and then further decreased to the minimum value Imin at time t2 after a predetermined time. Then, the value is increased to the target value $I_2$ at time t3. In this manner, by increasing the coil current Iobj to the maximum value Imax and then returning the coil current Iobj to the minimum value Imin, a certain history is given to the magnetic circuit of the objective lens 104, and the relationship between the coil current Iobj and the magnetic flux density Bobj is defined again by the ascending curve CR. That is, by determining the coil current Iobj, the magnetic flux density Bobj is uniquely determined in relation to the coil current Iobj according to the ascending curve CR. However, since the change amount of the current is large in the lens reset operation, the waiting time until the magnetic field responds is long (for example, several tens of seconds), and the throughput is lowered.

Therefore, in the conventional electron microscope, the frequency of the lens reset operation is reduced by determining the magnitude of the change in the coil current Iobj and determining the necessity of the lens reset operation. A procedure for estimating the magnetic flux density will be described with reference to a flowchart of FIG. 6.

Figure 6:
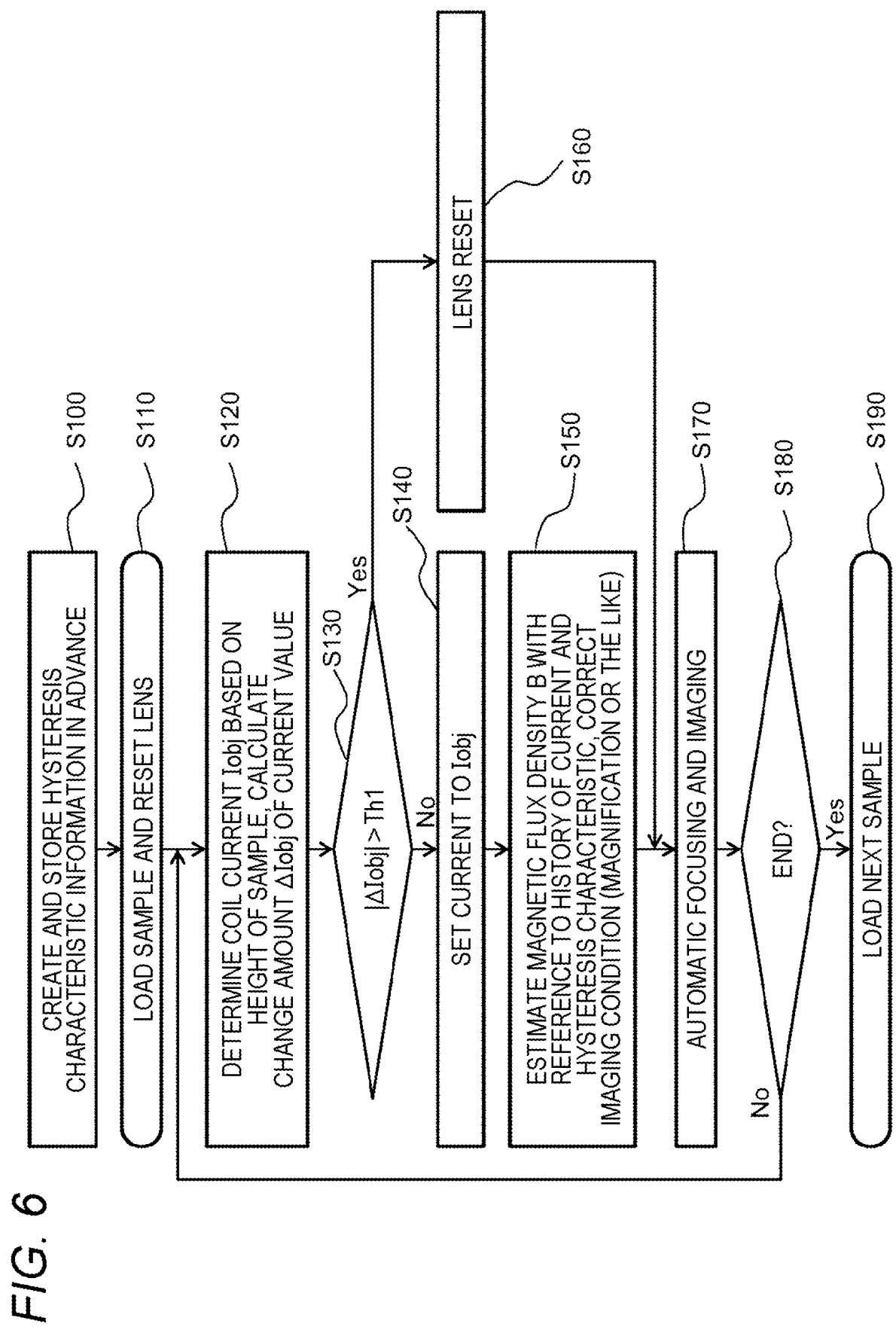
FIG. 6 is a flowchart illustrating an operation of a conventional scanning electron microscope (SEM).

As illustrated in FIG. 6, in the conventional scanning electron microscope, first, hysteresis characteristic information is created and stored in the database 114 (step S100). Next, after the sample S is placed (loaded) on the stage ST, the lens reset operation as described with reference to FIGS. 4 and 5 is performed (step S110).

Thereafter, the value of the coil current Iobj to be applied to the objective lens 104 is determined based on the height of the sample S (step S120). At this time, when the absolute value |Iobj| of the change amount ΔIobj of the coil current is larger than the predetermined value Th1 (|Iobj|>Th1), the relationship between the coil current Iobj and the magnetic flux density Bobj deviates from the known ascending curve CR. It is not possible to estimate how much the deviation is.

Therefore, in the conventional scanning electron microscope, it is determined whether or not the absolute value |ΔIobj| of the change amount of the coil current Iobj is larger than a threshold Th1 (step S130). When the variation is equal to or less than the threshold Th1 (No), the coil current Iobj is set to a determined value (step S140), and then the magnetic flux density Bobj output from the objective lens 104 is estimated with reference to the history of the coil current Iobj and the hysteresis characteristic information. Then, imaging conditions (deflection magnification, image rotation amount) are calculated according to the estimated magnetic flux density Bobj and transmitted to the magnification adjustment unit 118 and the image rotation unit 119 (step S150).

On the other hand, when the absolute value |ΔIobj| of the change amount of the coil current Iobj is larger than the threshold Th1 (Yes in step S130), the lens reset operation is executed (step S160). Then, autofocusing and imaging are executed in a state where the influence of the hysteresis characteristic is minimized by the lens reset operation (step S170). It is determined whether or not the imaging of the loaded sample S has ended (step S180), and in a case where the imaging is continued, the process returns to step S120 and the same operation is repeated. The imaging of the loaded sample S is finished, but if there is a next sample S, the next sample S is loaded (Yes in step S180) and same imaging is repeated. Note that there is also a case where the magnification or image rotation of the captured image is corrected without correcting the imaging condition (step S150).

Figure 7:
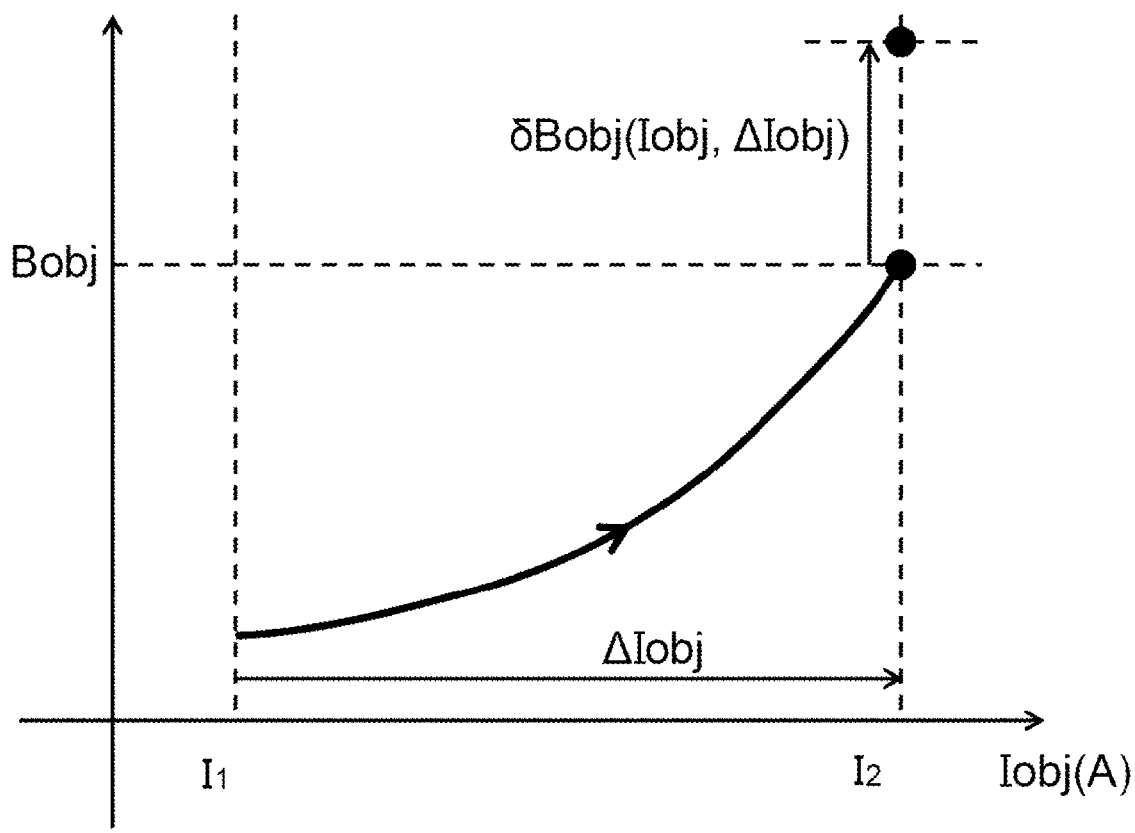
FIG. 7 is a graph for explaining a deviation between an estimated value of a magnetic flux density and an actual value.

As described above, in the conventional scanning electron microscope, the execution frequency of the lens reset is reduced by considering the hysteresis characteristic of the objective lens (steps S130 to S150). However, in a case where the fluctuation range of the coil current Iobj is large, a deviation occurs between the actual magnetic field and the estimated value due to the influence of the eddy current, so that the lens reset operation is required. This will be described with reference to FIG. 7. As illustrated in FIG. 7, a case where the coil current Iobj changes from the original value $I_1$ to $I_2$ is considered. At this time, if the change amount $\Delta Iobj = I_2 - I_1$ of the coil current Iobj is large, a difference δBobj occurs between the estimated magnetic flux density $Bobj = B_2$ and the actual magnetic flux density due to the influence of the eddy current. In order to avoid this deviation, a lens reset operation is required, and the throughput decreases. If the difference δBobj can be estimated or specified, the difference ΔBobj can be reflected in the control of the deflection magnification and the image rotation without the lens reset operation, and the captured image can be corrected.

Therefore, in the first embodiment, the influence of the eddy current generated when the coil current Iobj greatly changes is estimated in advance, and the data of the correction value for eliminating the influence of the eddy current is stored in the database 114 in advance. If the influence of eddy currents and the like is not considered as in the conventional technique (see FIG. 6), a deviation occurs between the actually generated magnetic field and the estimated magnetic field. Therefore, in a case where the change amount of the coil current is larger than a predetermined value, an error of the deflection magnification or the image rotation occurs, and as a result, the number of times of execution of the lens reset operation may increase. On the other hand, in the first embodiment, the data of the correction value reflecting the influence of the eddy current is stored in the database 114 in advance and used for the correction of the magnetic field. As a result, the frequency of the lens reset operation can also be reduced.

As illustrated in FIG. 7, in the first embodiment, data of the correction value δBobj (see FIG. 7) for correcting the deviation of the magnetic field due to the influence of the eddy current is acquired in advance and stored in the database 114. Then, in a case where the change amount ΔIobj of the coil current Iobj is larger than a predetermined value, the number of times of execution of the lens reset operation can be reduced by correcting the imaging condition with reference to this data.

The correction value δBobj can be measured using an autofocus function of the scanning electron microscope and then pre-stored in the database 114. Specifically, as illustrated in FIG. 7, the coil current Iobj is increased from a certain value $I_1$ to another value $I_2$, and autofocusing is performed in a state where the coil current $Iobj = I_2$. An adjustment amount of the focal position at that time is calculated, and this adjustment amount can be converted into a change amount δBobj of the magnetic flux density of the objective lens 104. In this conversion, the coil current Iobj and the change amount ΔIobj are set to various values, and the change amount δBobj of the magnetic flux density Bobj is calculated for each combination of the values of (Iobj, ΔIobj). The obtained various data combinations ΔBobj (Iobj, ΔIobj) are stored in the form of tables in the database 114. The autofocusing may be performed by adjusting the retarding voltage, the acceleration voltage of electrons, the height of the stage ST, and the like in addition to the adjustment of the lens magnetic field.

Figure 8:
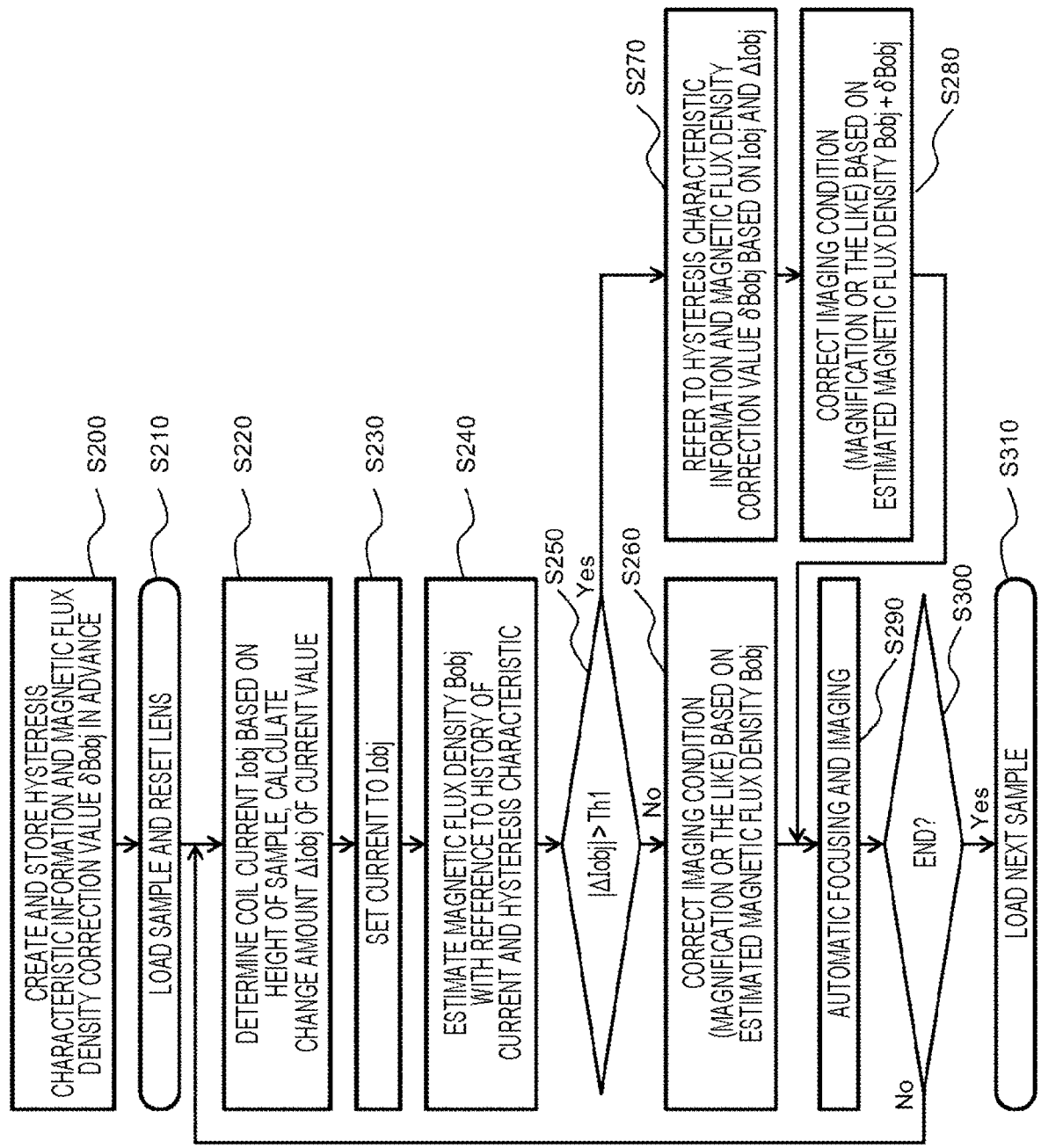
FIG. 8 is a flowchart illustrating an operation of the scanning electron microscope (SEM) according to the first embodiment.

A specific operation procedure of the scanning electron microscope of the first embodiment will be described with reference to FIG. 8. First, in addition to the hysteresis characteristic information, information on the correction value δBobj of the magnetic flux density is created in advance by the method described above and stored in the database 114 as a table (step S200).

Next, after the sample S is loaded, a lens reset operation is performed (step S210). Subsequently, the coil current Iobj is determined on the basis of the position of the sample S in the height direction, and a change amount ΔIobj from the original value of the coil current Iobj is calculated (step S220). Thereafter, the determined coil current Iobj is set (step S230).

Thereafter, the hysteresis characteristic information is referred to in the database 114 according to the variation history of the coil current Iobj. Based on this reference result, the magnetic flux density Bobj is estimated (step S240).

Next, it is determined whether or not the absolute value |ΔIobj| of the change amount of the coil current Iobj is larger than the threshold Th1 (step S250). In a case where the magnetic flux density is equal to or less than the threshold Th1, the processing proceeds to step S260, and imaging conditions (deflection magnification, image rotation amount) are calculated according to the magnetic flux density Bobj estimated in step S240, and are transmitted to the magnification adjustment unit 118 and the image rotation unit 119. Thereafter, autofocusing and imaging are performed (step S290). Steps S300 and S310 are the same as steps S180 and S190 in FIG. 6.

On the other hand, when the absolute value |ΔIobj| of the change amount is larger than the threshold Th1, the process proceeds to step S270. In the first embodiment, even if the absolute value |ΔIobj| is larger than the threshold Th1, the lens reset operation is not performed. In this case, the control unit 111 refers to the hysteresis characteristic information and refers to the correction value δBobj corresponding to the coil current Iobj and the change ΔIobj in the database 114 (step S270). Then, an estimated value of the magnetic flux density is set to Bobj+δBobj. The control unit 111 calculates imaging conditions (deflection magnification, image rotation amount) according to the set estimated value, and transmits the imaging conditions to the magnification adjustment unit 118 and the image rotation unit 119 (step S280). According to this imaging condition, autofocusing and imaging are performed (step S290).

As described above, according to the first embodiment, when the coil current Iobj greatly fluctuates except immediately after the sample S is loaded, the control unit 111 reads the correction value δBobj that reflects the influence of the eddy current and is stored in the database 114 in advance, and uses the correction value δBobj for the correction of the magnetic flux density Bobj. As a result, in the first embodiment, even in a case where the coil current Iobj fluctuates to a predetermined value or more, the imaging condition can be corrected in consideration of the influence of the eddy current. As a result, according to the first embodiment, it is possible to accurately estimate the magnetic field while reducing the frequency of the lens reset operation and improving the throughput accordingly.

Figure 9:
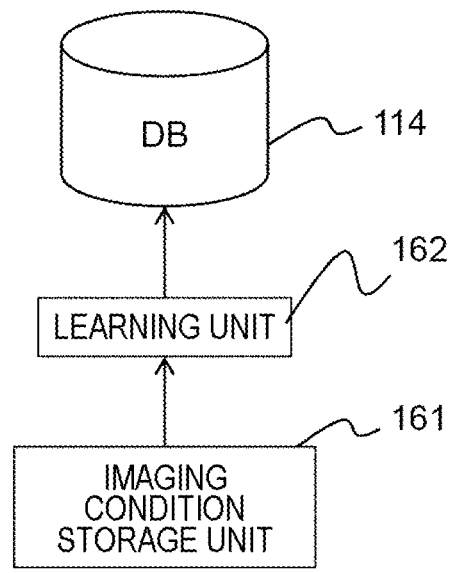
FIG. 9 illustrates a modification of the first embodiment.

Hereinafter, modifications of the first embodiment will be described. The hysteresis characteristic and the correction value δBobj may change over time, and it is necessary to update the information of the hysteresis characteristic and the correction value δBobj stored in the database 114 in order to maintain the estimation accuracy of the magnetic field. The correction value δBobj may be measured again at the time of maintenance of the apparatus, and the data of the correction value δBobj stored in the database 114 may be updated. Alternatively, as illustrated in FIG. 9, every time imaging is performed, an imaging condition f (α, β) set after correction based on the correction value δBobj read from the database 114 and an imaging condition f (α', β') when imaging is actually performed after autofocusing are stored in an imaging condition storage unit 161, and data of the collected imaging condition is learned by a machine learning unit 162. According to the result of this learning, the correction value δBobj stored in the database 114 can be updated.

Second Embodiment

Next, a scanning electron microscope according to a second embodiment of the present invention will be described. Since the external configuration of the scanning electron microscope of the second embodiment is the same as that of the first embodiment (see FIG. 1), redundant description will be omitted. However, the method of controlling the coil current is different in the second embodiment. This difference will be described with reference to FIGS. 10 and 11.

In the first embodiment, when the change amount ΔIobj of the coil current Iobj is larger than a predetermined value, the correction value δBobj of the magnetic flux density is read from the database 114, and the imaging condition is corrected according to the correction value δBobj. On the other hand, in the second embodiment, the correction value δIobj of the coil current Iobj is read from the database, and the coil current Iobj is corrected according to the correction value δIobj. That is, the control unit 111 of the second embodiment functions as a current correction unit that corrects the coil current Iobj on the basis of the coil current Iobj and the correction value δIobj according to the change amount ΔIobj in a case where the absolute value |ΔIobj| of the change amount of the coil current Iobj is larger than a predetermined value.

Figure 10:
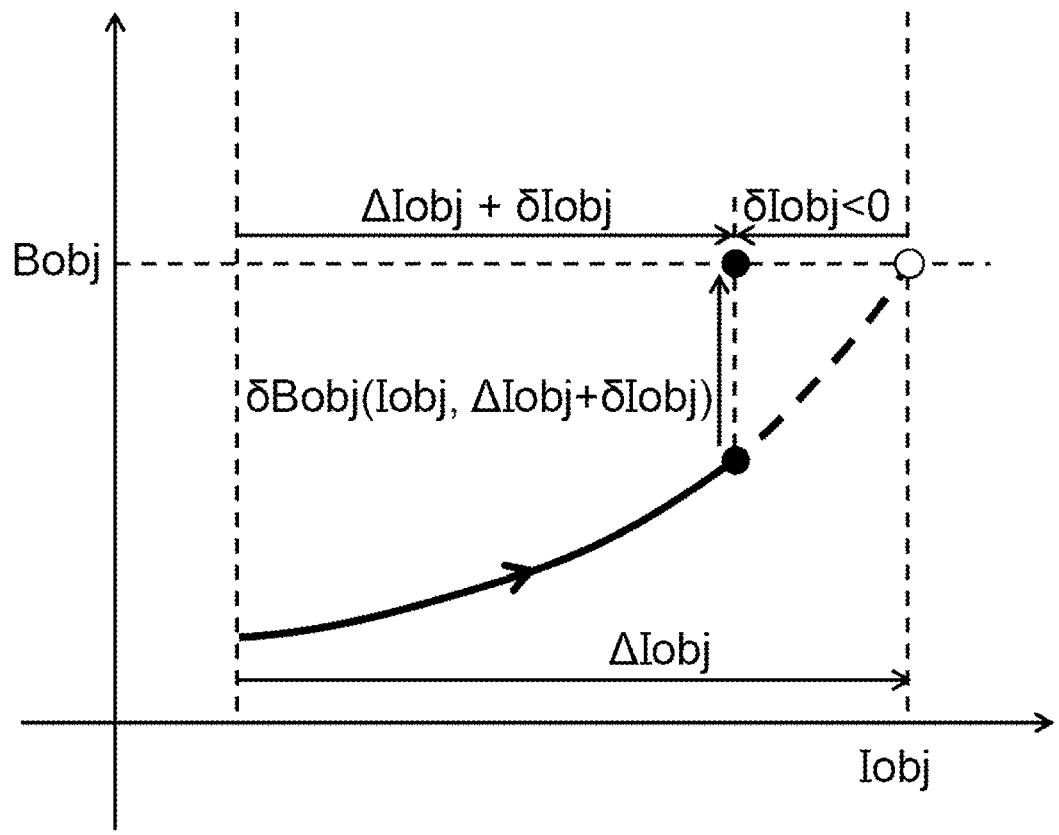
FIG. 10 is a graph for explaining a deviation of a magnetic flux density and a correction of a current.

The correction of the second embodiment will be described with reference to FIG. 10. A case where the coil current Iobj is changed from $I_1$ to $I_2$ (variation value ΔIobj) will be considered. In this case, as described in the first embodiment (see FIG. 6), when the coil current Iobj is increased to $I_2$, the magnetic flux density Bobj may be larger than the assumed value $B_2$ by ΔBobj (>0). In the first embodiment, the value of ΔBobj is used for correction. Instead, in the second embodiment, the correction value δIobj (in FIG. 10, ΔIobj is a negative value) of the coil current Iobj is read from the database 114, and the coil current Iobj is corrected using the correction value δIobj. That is, the coil current Iobj is not set to the value $I_2$, but is set to $I_2$+δIobj to which the correction value δIobj (<0) is added. The correction value δIobj can be obtained by calculating backward from δBobj acquired in the first embodiment. Similarly to the correction value δBobj, the correction value δIobj also becomes a value depending on the coil current Iobj, the change ΔIobj, and the hysteresis characteristic.

Figure 11:
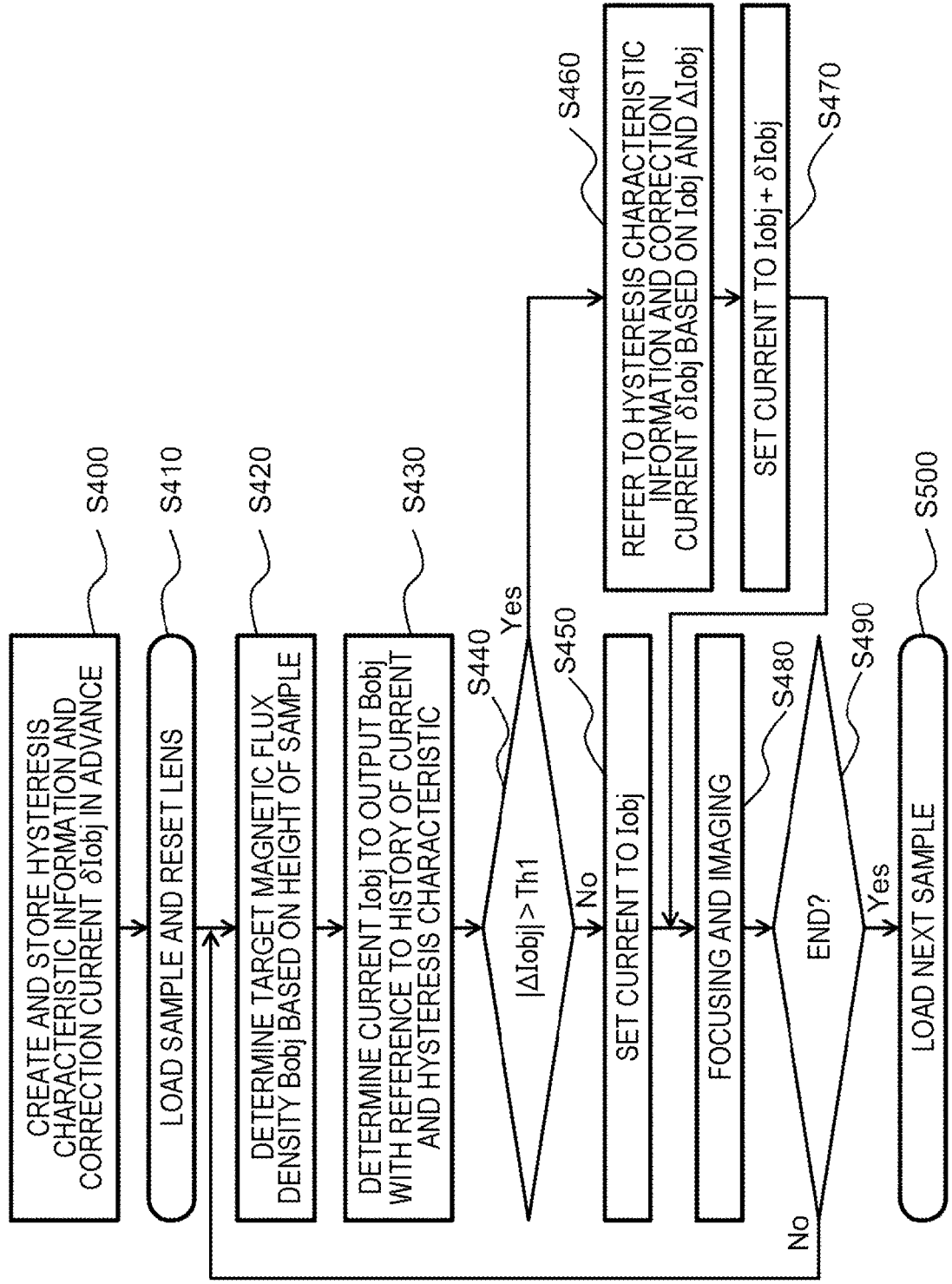
FIG. 11 is a flowchart illustrating operation of the scanning electron microscope (SEM) according to a second embodiment.

Here, an operation of the scanning electron microscope of the second embodiment will be described with reference to FIG. 11. First, in addition to the hysteresis characteristic information, data of the correction value δIobj described above is created and stored in advance, and stored in the database 114 (step S400).

Next, after the sample S is loaded, a lens reset operation is performed (step S410). Subsequently, the target magnetic flux density Bobj is determined based on the position of the sample S in the height direction (step S420), and then the history and hysteresis characteristics of the coil current Iobj are referred to in the database 114 to set the coil current Iobj that gives the determined target magnetic flux density Bobj (step S430). At this time, a change amount ΔIobj of the coil current Iobj that gives the target magnetic flux density Bobj is also calculated.

Next, it is determined whether or not the absolute value |ΔIobj| of the change amount of the coil current Iobj is larger than the threshold Th1 (step S440). In a case where the coil current Iobj is equal to or less than the threshold Th1 (No), the coil current Iobj is set according to the magnetic flux density Bobj determined in step S420 (step S450), and similarly to the first embodiment, imaging conditions (deflection magnification, image rotation amount) are calculated, and autofocusing and imaging are executed (step S480). Steps S490 and S500 are the same as steps S300 and S310 in FIG. 8.

On the other hand, when the absolute value |ΔIobj| of the change amount is larger than the threshold Th1 (Yes in step S440), the process proceeds to step S460. The control unit 111 refers to the hysteresis characteristic information in the database 114, and refers to the correction value δIobj corresponding to the coil current Iobj and the change ΔIobj in the database 114. Then, the coil current Iobj is set to $I_2$+δIobj (step S470). Under the coil current Iobj thus corrected, autofocusing and imaging are performed (step S480). The subsequent steps are similar to those in the first embodiment. As described above, according to the second embodiment, when the coil current Iobj greatly fluctuates except immediately after the sample S is loaded, the correction value δIobj that reflects the influence of the eddy current and is stored in advance in the database 114 is read and used for the correction of the coil current Iobj.

As a result, in the second embodiment, even in a case where the coil current Iobj fluctuates to a predetermined value or more, the imaging condition can be corrected in consideration of the influence of the eddy current. As a result, according to the second embodiment, the frequency of the lens reset operation can be reduced, and the throughput can be improved accordingly. Furthermore, in the second embodiment, since the magnetic flux density of the objective lens 104 can be set to a target value with high accuracy, the correction of the imaging condition (step S280) performed in the first embodiment becomes unnecessary.

According to the second embodiment, the same effects as those of the first embodiment can be obtained. In addition, in the second embodiment, the magnetic flux density of the objective lens 104 can be set to a desired value (deviated by δBobj in the first embodiment), and for example, a change in resolution and image distortion caused by focusing by a retarding voltage can be suppressed. Therefore, it is possible to perform high-quality imaging and highly accurate length measurement as compared with the first embodiment.

Although some embodiments of the present invention have been described above, these embodiments have been presented as examples, and are not intended to limit the scope of the invention. These novel embodiments can be implemented in various other forms, and various omissions, substitutions, and changes can be made without departing from the gist of the invention. These embodiments and modifications thereof are included in the scope and gist of the invention, and are included in the invention described in the claims and the equivalent scope thereof.

REFERENCE SIGNS LIST 101 electron gun
102 focusing lens
103 scanning coil
104 objective lens
106 primary electron detector
107 object surface position detector
108 secondary electron detector
111 control unit
112 RAM
113 ROM
114 database
115 XY scanning unit
116 image processing unit
117 display
118 magnification adjustment unit
119 image rotation unit
120 retarding voltage control unit
121 acceleration voltage control unit
131 magnetic lens
151 stage control unit
S sample
ST stage

The invention claimed is:

1. A charged particle beam device comprising:
a charged particle beam source that generates charged particle beams;
an objective lens in which coil current is inputted to focus the charged particle beams on a sample;
a control unit that controls the coil current;
a hysteresis characteristic storage unit that stores hysteresis characteristic information of the objective lens;
a history information storage unit that stores history information relating to the coil current;
an estimating unit that estimates a magnetic field generated by the objective lens based on the coil current, the history information, and the hysteresis characteristic information; and
a magnetic field correction unit that, when an absolute value of a change amount of the coil current is greater than a predetermined value, further adds a correction value corresponding to the coil current and the change amount of the coil current to the magnetic field estimated by the estimating unit to correct the magnetic field generated by the objective lens.

2. The charged particle beam device according to claim 1, further comprising a database that stores the coil current, a change amount of the coil current, and the correction value in association with each other,
wherein the magnetic field correction unit reads the correction value corresponding to the coil current and the change amount of the coil current from the database.

3. The charged particle beam device according to claim 1, further comprising a magnification adjustment unit that corrects a deflection magnification of a captured image according to the magnetic field estimated by the estimating unit or corrected by the magnetic field correction unit.

4. The charged particle beam device according to claim 1, further comprising an image rotation unit that corrects image rotation of a captured image according to the magnetic field estimated by the estimating unit or corrected by the magnetic field correction unit.

5. The charged particle beam device according to claim 2, further comprising:
an imaging condition storage unit that stores an imaging condition set after correction by the magnetic field correction unit and an imaging condition when imaging is performed after subsequent autofocusing; and
a learning unit that learns the imaging condition stored in the imaging condition storage unit,
wherein the database is updated in accordance with a result of learning in the learning unit.

6. A charged particle beam device comprising:
a charged particle beam source that generates charged particle beams;
an objective lens in which coil current is inputted to focus the charged particle beams on a sample;
a control unit that controls the coil current;
a hysteresis characteristic storage unit that stores hysteresis characteristic information of the objective lens;
a history information storage unit that stores history information relating to the coil current;
an estimating unit that estimates the magnetic field generated by the objective lens based on the coil current, the history information, and the hysteresis characteristic information; and
a current correction unit that, when an absolute value of a change amount of the coil current is larger than a predetermined value, corrects the coil current based on a correction value corresponding to the coil current and the change amount of the coil current.

7. The charged particle beam device according to claim 6, further comprising a database that stores the coil current, a change amount of the coil current, and the correction value in association with each other, wherein the current correction unit reads the correction value corresponding to the coil current and a change amount of the coil current from the database.

\* \* \* \* \*